United States Patent [19]

Tom et al.

[11] Patent Number: 5,156,827
[45] Date of Patent: Oct. 20, 1992

[54] APPARATUS, PROCESS, AND COMPOSITION FOR IN-SITU GENERATION OF POLYHYDRIDIC COMPOUNDS OF GROUP IV-VI ELEMENTS

[75] Inventors: Glenn M. Tom, New Milford; James V. McManus, Danbury, both of Conn.

[73] Assignee: Advanced Technology Materials, Inc., Danbury, Conn.

[21] Appl. No.: 323,311

[22] Filed: Mar. 14, 1989

[51] Int. Cl.$^5$ .......................... C01B 6/00; C01B 6/06; C01B 25/06; C01B 33/04
[52] U.S. Cl. ................................. 423/299; 252/188.1; 252/188.26; 422/211; 422/222; 423/347; 423/509; 423/561.1; 423/644; 423/645
[58] Field of Search ............ 423/347, 299, 645, 561.1, 423/509, 352, 489, 490, 491, 495, 498, 499, 563; 422/211, 222

[56] References Cited

U.S. PATENT DOCUMENTS

| | | | |
|---|---|---|---|
| 4,761,395 | 8/1988 | Tom et al. | 423/304 |
| 4,950,419 | 8/1990 | Tom et al. | 423/219 |

FOREIGN PATENT DOCUMENTS

| | | | |
|---|---|---|---|
| 664520 | 9/1965 | Belgium | 423/645 |
| 225684 | 8/1985 | Fed. Rep. of Germany | 423/645 |

OTHER PUBLICATIONS

Chemical Abstracts 97(2):9735d.
J. La Dou, "The Use of Toxic Gases in the Microelectronic Industry" Safety Aspects of Effluents from cvd Process Systems May 3, 1986.
Western Fire Chief's Association, Article 51, Uniform Fire Code, 1985 addition, p. 141.
Matheson Gas Databook, p. 41, 1980.

Primary Examiner—Wayne A. Langel
Attorney, Agent, or Firm—Steven J. Hultquist

[57] ABSTRACT

A system for generating a gaseous polyhydridic Group IV-VI compound, comprising a vessel containing a solid precursor metal compound for the polyhydridic Group IV-VI compound, and a source of a fluid-phase protonic activator compound reactive with the precursor compound to yield as reaction product (a) the polyhydridic compound and (b) a solid reaction product compound containing the metal moiety, e.g., a nonvolatile metal salt, together with means for flowing the activator compound from the source thereof to the vessel containing the solid precursor compound. The precursor compound may suitably comprise a metal moiety such as lithium, sodium, magnesium, zinc, potassium, aluminum, and intermetallic complexes and alloys thereof. In a preferred aspect, wherein arsine is generated, the precursor compound may suitably comprise a metal arsenide, and the protonic activator compound is water or an acid such as hydrogen chloride. An appertaining method of generating such polyhydridic Group IV-VI compounds is likewise disclosed, together with a reaction vessel for carrying out the contacting of precursor and activator therein. Various precursor compositions, including various support materials, are discribed. The gas generating system of the invention obviates the need for large inventories of high pressure gas cylinders in semiconductor manufacturing operations, and produces the desired Group IV-VI hydride compound in situ on demand in a safe and controllable fashion.

23 Claims, 5 Drawing Sheets

APPARATUS, PROCESS, AND COMPOSITION FOR IN-SITU GENERATION OF POLYHYDRIDIC COMPOUNDS OF GROUP IV-VI ELEMENTS

BACKGROUND OF THE INVENTION

1. Field of the Invention

This invention relates generally to apparatus and method for generating gaseous polyhydridic compounds of Group IV-VI elements, e.g., arsine, phosphine, silane, germane, hydrogen sulfide, hydrogen selenide, and hydrogen telluride, in situ, from solid precursor compounds therefor and also relates to the solid precursor compositions themselves.

2. Description of The Related Art

In the manufacture of semiconducting materials and semiconductor devices, various hazardous gaseous compounds containing elements from Groups IV-VI of the Periodic Table are widely employed.

Among the aforementioned hazardous gas compounds containing Group IV-VI consituent elements are the polyhydridic compounds set out below.

Group IV: silane, and germane.
Group V: ammonia, phosphine, arsine, and stibine.
Group VI: hydrogen sulfide, hydrogen selenide, and hydrogen telluride.

The above-listed gaseous compounds are required in widely varying concentrations in semiconductor manufacturing plants, and at widely varying flow rates. As a result of toxicity and safety considerations, these hazardous gaseous compounds must be carefully handled in the semiconductor manufacturing facility.

In conventional practice, the aforementioned Group IV-VI gaseous compounds are provided in the semiconductor manufacturing plant in high pressure gas cylinders. Depending on the scale of the semiconductor manufacturing operation, the inventory of such high pressure gas cylinders typically is quite large. With such large inventories of high pressure gas cylinders, there is the associated danger of tank ruptures resulting in gross introduction of the hazardous gaseous compound to the environment in the manufacturing plant. There is also the danger, even more insidious, of leakages from such cylinders due to defects in or damage to the cylinder heads, gas flow regulators, and the like, which are a not infrequent occurence in instances where large numbers of high pressure gas cylinders are present.

In addition to the safety and toxicity considerations associated with the risk of undesired introduction of the Group IV-VI hazardous gas to the ambient air in the semiconductor plant, in instances where a multiplicity of high pressure gas cylinders are employed to supply the Group IV-VI gas, there are also the logistical difficulties involved in the storage and transport of large numbers of high pressure gas cylinders. Such gas cylinders are typically quite heavy, and thus are not easily moved or installed in the semiconductor manufacturing plant. Due to their bulky and unwieldy character, such gas cylinders typically require mechanical transport means to move same from place to place in the semiconductor manufacturing plant, and special mounts and retention structures typically are required to hold the cylinders in position when installed in the semiconductor manufacturing facility.

As an example of the foregoing considerations attendant the use of Group IV-VI hydridic compounds, arsine is currently indispensible in the fabrication of both compound (e.g., gallium arsenide) and silicon semiconductor devices.

Arsine is required in high concentrations for the preparation of compound semiconductors during the deposition process, as well as a large inventory of arsine for the maintenance of continuous operations. Such large arsine inventories are associated with a large number of high pressure arsine gas cylinders, since conventional gas cylinders generally contain from about 1 to 10 pounds of arsine ($AsH_3$) per cylinder. See, for example, J. La Dou, "The Use of Toxic Gases in The Microelectronic Industry," presented at the STEP/SEMI program: *Safety Aspects of Effluents From CVD Process Systems*, May 23, 1986; and Western Fire chief's Association, Article 51, Uniform Fire Code, 1985 Addition, page 141.

On the other hand, in the manufacture of silicon-based semiconductor devices, arsine is employed as a dopant material at relatively low concentrations, on the order of from about 20 to about 100 parts per million. Even though used in dilute gas mixtures in such application, there remains the risk of a high pressure gas cylinder of arsine rupturing or leaking, and releasing all of the contained arsine into the surrounding environment in the manufacturing plant.

It would therefore be a significant advance in the art to provide arsine, as well as other hydridic Group IV-VI hydridic compounds, in a manner which avoids the difficulties and hazards attendant the use of high pressure gas cylinders containing such compounds.

Accordingly, it is an object of the present invention to provide an apparatus, method, and composition for generating polyhydridic gaseous compounds of Group IV-VI elements in situ, thereby obviating the need for bulk provision of such gaseous compounds in high pressure gas cylinders.

It is another object of the present invention to provide a solid precursor composition for in situ generation of polyhydridic compounds of Group IV-VI elements, which may be usefully employed to generate the desired gaseous compound on demand at purity levels consistent with the requirements of semiconductor manufacturing operations.

Other objects and advantages of the present invention will be more fully apparent from the ensuing disclosure and appended claims.

SUMMARY OF THE INVENTION

In one aspect, the present invention relates to a system for generating a gaseous polyhydridic compound of the formula:

$$GH_n$$

wherein n is a number having a value of 2 to 4, inclusive, and G is an n-valent Group IV-VI element, such system comprising:

(i) a reaction vessel containing a composition comprising a solid precursor compound for the polyhydridic compound, of the formula:

$$M_xG_yH_z,$$

wherein: M is a metal moiety selected from the group consisting of lithium, sodium, magnesium, zinc, potassium, aluminum, and intermetallic complexes and alloys thereof; x is a number having a value of from 1 to 3, inclusive; y is a number having a value of from 1 to 2, inclusive; and z is a number having a value of from 0 to 4; inclusive;

(ii) a source of a fluid-phase protonic activator compound which is reactive with the precursor compound to yield as reaction product (a) the aforementioned polyhydridic compound and (b) a solid reaction product compound containing the metal moiety M;

(iii) means for flowing the activator compound from the aforementioned source thereof to the reaction vessel containing the solid precursor compound for the polyhydridic compound, for reaction of said activator compound with the solid precursor compound to form the polyhydridic compound in the reaction vessel; and (iv) means for discharging the polyhydridic compound from the reaction vessel.

In a preferred aspect, the above-described system entails as the n-valent Group IV-VI element G, an element selected from the group consisting of silicon, phosphorus, arsenic, antimony, sulfur, selenium, and tellurium.

In a broad method aspect, the present invention relates to generating a gaseous polyhydridic compound of the formula:

$$GH_n$$

wherein n is an integer having a value of 2 to 4, inclusive, and G is an n-valent Group IV-VI element, comprising reacting (A) a solid precursor compound for the polyhydridic compound, of the formula:

$$M_xG_yH_z.$$

wherein: M is a metal moiety selected from the group consisting of lithium, sodium, magnesium, zinc, potassium, aluminum, and intermetallic complexes and alloys thereof; x is a number having a value of 1 to 3, inclusive; y is a number having a value of 1 to 2, inclusive; and z is a number having a value of 1 to 4, inclusive; with (B) a fluid-phase protonic activator compound to yield as reaction product (a) the aforementioned polyhydridic compound and (b) a solid reaction product compound containing the metal moiety M; and recovering the polyhydridic compound from the reaction.

In a preferred apparatus and method aspect, the invention relates to the generation of arsine, wherein the protonic activator compound is selected from the group consisting of hydrogen halides and water, and the solid precursor compound is selected from the group consisting of: $Li_3As$; $LiAsH_2$; $NaAsH_2$; $Mg(AsH_2)_2$; $Zn_3As_2$; $AlAs$; and $[Na/K]AsH_2$, and wherein the solid precursor compound is dispersed on an inert support.

In another aspect, the present invention relates to the precursor source compositions for generating gaseous polyhydridic compounds, comprising the solid precursor compounds broadly described hereinabove, dispersed on an inert support.

Other aspects and features of the present invention, including various apparatus, method, and composition aspects of the invention, will be more fully apparent from the ensuing disclosure and appended claims.

DETAILED DESCRIPTION OF THE INVENTION, AND PREFERRED EMBODIMENTS THEREOF

Figure 1:
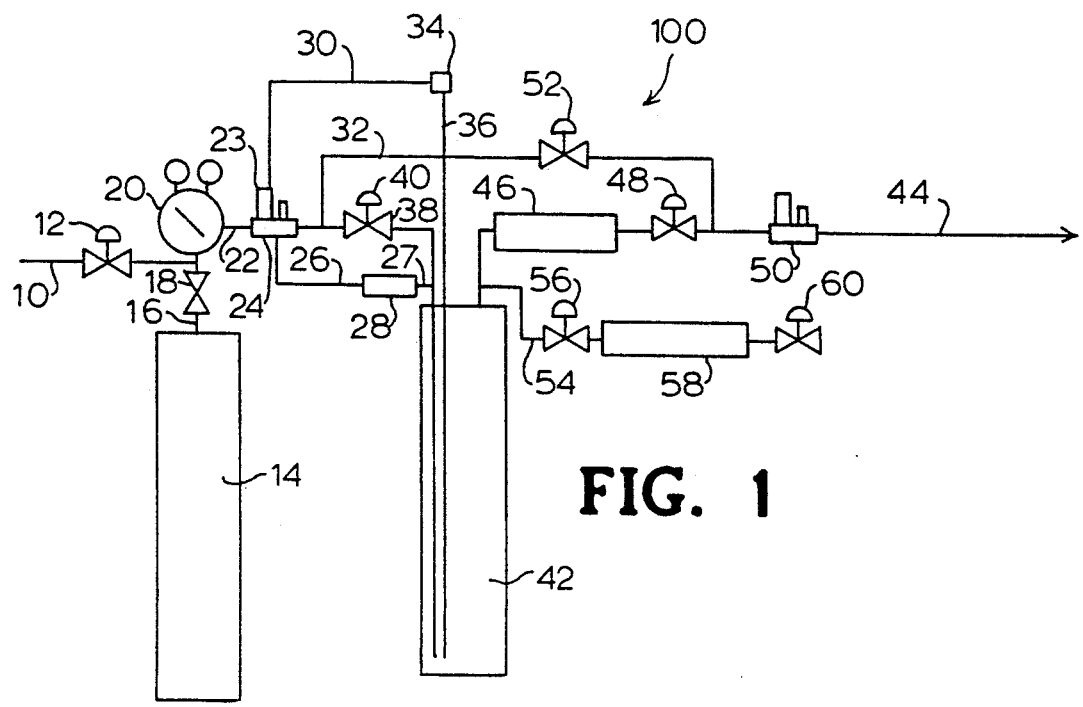
FIG. 1 is a schematic illustration of a process system for in situ generation of polyhydridic Group IV-VI gaseous compounds, according to one embodiment of the present invention.

In accordance with the present invention, a gaseous polyhydridic compound of a selected Group IV-VI element is generated in situ by reaction of (i) a solid precursor compound for the polyhydridic product compound with (ii) a fluid-phase protonic activator compound for the solid precursor compound. Such in situ generation of the desired Group IV-VI gaseous compound substantially reduces or in some instances completely eliminates the inventory of on-site gaseous compound which is necessary to satisfy operating demands in the semiconductor manufacturing facility. The Group IV-VI gaseous compound generating system of the present invention is compact and efficient, readily fitting into a standard gas cabinet, and is compatible with the procedures and hardware employed in conventional semiconductor manufacturing plants.

Thus, by means of the Group IV-VI gaseous compound generating system of the present invention, the desired gaseous compound is produced in a simple and straightforward fashion from only two components, a solid precursor and a fluid (gaseous or liquid) activator. While these two components are kept separate, no Group IV-VI gaseous compound is present or produced. Upon mixing and reaction of these two components, substantially pure Group IV-VI gaseous compound is generated in an inherently safe and highly controlled manner.

The polyhydridic Group IV–VI gaseous compounds generatable by the apparatus and method of the present invention include those of the formula:

$$GH_n$$

wherein: n is a number having a value of from 2 to 4, inclusive, and G is an n-valent Group IV–VI element.

Preferred Group IV–VI elemental constituents of the polyhydridic gaseous compounds generatable by the apparatus and method of the present invention, and their corresponding polyhydridic compounds, are set out below:

| Group IV–VI Element | Polyhydridic Compound |
|---|---|
| Si | Silane |
| P | Phosphine |
| As | Arsine |
| Sb | Stibine |
| S | Hydrogen Sulfide |
| Se | Hydrogen Selenide |
| Te | Hydrogen Telluride |

As indicated hereinabove, the desired Group IV–VI gaseous polyhydridic compound is produced in accordance with the present invention by reaction of a fluid-phase protonic activator compound with a solid precursor compound for the polyhydridic product compound.

The solid precursor compound for the desired polyhydridic Group IV–VI compound may suitably be of the formula:

$$M_xG_yH_z.$$

wherein: M is a metal moiety selected from the group consisting of lithium, sodium, magnesium, zinc, potassium, aluminum, and intermetallic complexes and alloys thereof; x is a number having a value of 1 to 3, inclusive; y is a number having a value of 1 to 2, inclusive; and z is a number having a value of 0 to 4, inclusive.

In some instances, for purposes of achieving a highly efficient production of the desired gaseous polyhydridic compound, the solid precursor compound may suitably be dispersed on an inert support. In other applications, such as where the solid precursor compound is provided in fine particulate form and is contacted with a liquid-phase protonic activator compound, the reactivity of the precursor and activator may be such that it is not necessary to disperse the solid precursor compound on a support in order to achieve high rate production of the desired polyhydridic gaseous product.

When the solid precursor compound is employed in a dispersed form on an inert support, the supports potentially useful for the solid precursor compounds to form a precursor source composition for the desired polyhydridic Group IV–VI gaseous compound, may include any suitable support materials which are compatible with the solid precursor compound, the fluid-phase protonic activator compound, the reaction products of the precursor/activator reaction, and any intermediates involved in such reactions, and which are stable under the conditions of use. Accordingly, the support should have sufficiently high temperature stability, chemical stability, and porosity characteristics, appropriate to its use.

Illustrative support materials which may be potentially useful in the broad practice of the present invention include materials such as aluminosilicates, alumina, silica, kieselguhr, activated carbon, metal fluorides, polystyrenedivinylbenzene, and fluorocarbon polymers. As used herein, the term "aluminosilicates" means a support composition including the elements aluminum, silicon, and oxygen, such as molecular sieves. Such aluminosilicates may be natural or synthetic in character.

The preferred characteristics of supports which are useful for solid precursor compositions in the present invention include (a) high surface area, as for example a surface area in the range of from about 50 to about 1,000 square meters per gram of support, (b) high porosity, such as a significant porosity from pores of a diameter in the range of from about 3 to about 200 Angstroms, and (c) good thermal stability, e.g., thermally stable at temperatures up to about 250° C.

Preferred supports in the broad practice of the present invention include aluminas, silicas, molecular sieves, and other aluminosilicates.

There is a special requirement for the support material when the fluid-phase protonic activator compound is hydrogen fluoride. In such instance, common metal oxides are attacked by the hydrogen fluoride and undergo severe hydrolysis. Accordingly, when hydrogen fluoride is employed as the activator component, the support suitably is varied from the otherwise preferred support materials; in these applications, metal fluorides or porous fluorinated polymers such as polytetrafluoroethylene (PTFE) are advantageously employed as the support materials.

The protonic activator compound is a proton-donating compound in reaction with the solid precursor material to yield the desired polyhydridic Group IV–VI gaseous compound as a reaction product. The protonic activator compound may comprise any suitable compound which is effective for such purpose. In a preferred aspect of the present invention, the protonic activator compound is either a hydrogen halide or water.

Among the criteria for the protonic activator compound are the following:

(1) the activator should be a strong acid that will react cleanly (i.e., substantially, quantitatively) with the precursor compound;

(2) the activator, if provided as a vapor phase compound should be highly volatile in character, with a vapor pressure equal to at least the desired delivery pressure of the polyhydridic Group IV–VI gaseous compound product, e.g., at least 20–30 psig; if the activator is provided as a liquid-phase compound, such vapor pressure constraint is removed.

(3) the activator should be readily available in high purity.

(4) the activator should be innocuous in the process system in which the product polyhydridic Group IV–VI gaseous compound is employed, or else it should be capable of removal by the precursor or purification post-treatment.

Among the various possible protonic activator compounds, water and hydrogen halides generally are preferred, with water typically being most preferred in practice The corresponding criteria for the solid precursor compound are the following:

(1) the precursor should have a low molecular weight.

(2) the precursor should be thermally stable.

(3) the precursor should be readily reactive with the activator compounds to yield the desired polyhydridic Group IV-VI gaseous compound, with any other reaction products being of a substantially non-volatile character, so that the desired gaseous polyhydridic compound is obtained in high purity.

(4) the precursor compound should be non-reactive with the carrier gas, if any, which is employed to carry the activator into contact with the precursor material and to transport the polyhydridic product gas out of the activator/precursor reaction zone.

(5) the precursor should not react to produce substantial amounts of hydridic product(s) when exposed to air (the precursors illustratively discussed herein oxidize in air to non-volatile species before they can form the free hydride).

A preferred polyhydridic Group IV-VI gaseous compound obtainable in the practice of the present invention is arsine ($AsH_3$), and the ensuing discussion will be directed primarily to such gaseous compound, as illustrative of the various aspects and features of the present invention. It will be recognized, however, that such description as follows is not to be limitingly construed as regards the broad applicability of the present invention, but is merely set forth to illustrative the present invention with reference to a preferred product species.

Arsine is generatable in the practice of the present invention from a solid precursor compound therefor, of the formula $M_xAs_yH_z$, wherein M is a metal moiety selected from the group consisting of lithium, sodium, magnesium, zinc, potassium, aluminum, and intermetallic complexes and alloys thereof; x is a number having a value of from 1 to 3, inclusive; y is a number having a value of from 1 to 2, inclusive; and z is a number having a value of from 0 to 4, inclusive.

Preferably, the arsine precursor compound is one of the following compounds:

$Li_3As$
$LiAsH_2$
$NaAsH_2$
$Mg(AsH_2)_2$
$Zn_3As_2$
$AlAs$
$[Na/K]AsH_2$

A preferred precursor compound for arsine chosen from the foregoing species is $[Na/K]AsH_2$, wherein "[Na/K]" denotes an alloy of sodium and potassium. This alloy is thermally stable to 100° C.; its lowest melting point eutectic composition has a melting point of 0° C.

The sodium/potassium dihydrogen arsenide precursor compound ($[Na/K]AsH_2$) referred to in the preceeding paragraph may readily be formed by the following procedure.

First, a sodium/potassium alloy is placed in a metal vessel. If the precursor compound is to be unsupported (i.e., utilized solely by itself, without any associated support material), the alloy alone is placed into the vessel. If, on the other hand, the precursor compound is to be deployed on an associated substrate material, the support material, such as in the form of pellets or other particles thereof, is added to the vessel along with the alloy. These transfers of material to the metal vessel are carried out in an inert atmosphere glove box. The alloy material in the metal vessel then is cooled to liquid nitrogen temperature and dry ammonia is condensed onto the alloy. The resulting matrix next is warmed to approximately minus 77° C. to melt the ammonia and allow the alloy to react therewith After approximately one hour at this temperature level, the vessel is chilled again to liquid nitrogen temperature. The proper amount of arsine gas then is added to the vessel and frozen out therein. Next, the vessel and its contents are warmed to approximately minus 77° C. to react solvated electrons with the arsine in the vessel, which is accompanied by the evolution of hydrogen. After approximately two hours, the liquefied gases are removed under vacuum to yield the dry metal alloy arsenic salt as the desired precursor compound.

The invention will now be described with reference to the generation of arsine from a solid arsine precursor and a gaseous activator. The first component, the arsenic-containing precursor, is suitably a non-volatile, relatively inert compound, which is non-productive of arsine in air exposure, thermally stable, converts efficiently to arsine, emits substantially no contaminants into the process gas stream, and is of low molecular weight. The precursor compound, as indicated, may suitably be supported on an inert support substrate, which may for example be in the form of pellets or other discrete particulate support media, such as may be utilized in the form of a bed of the precursor-comprising support composition. It may be desirable to deploy the precursor compound on a support to achieve a high degree of thermal control of the arsine generation reaction, and to obtain high kinetic efficiency in the arsine generation reaction.

The precursor compound for arsine is suitably chosen so that it will not release arsine into the air even if the precursor compound is spilled or otherwise exposed to the ambient environment in the semiconductor manufacturing facility, or in other end use application environments.

As indicated a preferred support material for the precursor compounds of the present invention is alumina.

The second component of the in situ arsine generator is a fluid i.g., gas or liquid, that will react with the non-volatile arsine precursor compound to yield substantially pure arsine gas. The activator component should react readily and cleanly (i.e., substantially quantitatively) with the arsine precursor. It should, if a gas, have a vapor pressure equal to at least the desired delivery pressure of the arsine gas, e.g., on the order of at least 20-30 psi., and the activator should be available in high purity. A preferred gaseous activator meeting such criteria is hydrogen chloride; a preferred liquid-phase activator is water. In generally, arsine yields are much higher when water is employed as the activator than when hydrogen chloride is utilized, but among gaseous activators hydrogen chloride is typically a preferred activator species.

The arsine generation reactions between hydrogen chloride and various illustrative arsine precursor compounds is set forth below:

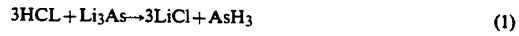  $3HCL + Li_3As \rightarrow 3LiCl + AsH_3$ (1)

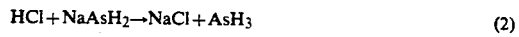  $HCl + NaAsH_2 \rightarrow NaCl + AsH_3$ (2)

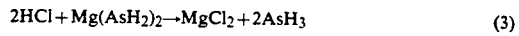  $2HCl + Mg(AsH_2)_2 \rightarrow MgCl_2 + 2AsH_3$ (3)

  $6HCl + Zn_3As_2 \rightarrow 3ZnCl_2 + 2AsH_3$ (4)

  $3HCl + AlAs \rightarrow AlCl_3 + AsH_3$ (5)

$$HCl + [Na/K]AsH_2 \rightarrow [Na/K]Cl + AsH_3 \quad (6)$$

Arsine is generated in the foregoing reactions by protonysis of a metal arsenic compound, such as a metal arsenide, to yield arsine gas and a substantially non-volatile reaction by-product metal salt. The solid reaction product of the hydride-generating reaction is the metal (M) salt of the anion of the protonic reactant. If a hydrogen halide is utilized as an activator, the solid reaction product is of the formula $MX_p$, and if water is used as a liquid-phase activator in the hydride-generating reaction, the solid reaction product is of the formula $M(OH)_p$, wherein X is the halide, and p is the valency of metal M.

All of the arsine precursor compounds illustratively employed in reactions (1)–(6) above are known and commercially available.

In lieu of the lithium arsenide compound ($Li_3As$) employed in reaction (1) as the arsine precursor compound, lithium dihydrogen arsenide ($LiH_2As$) may be employed. Lithium dihydrogen arsenide reacts quantitatively with hydrogen chloride to form arsine as the desired gaseous product, together with lithium chloride as the solid reaction by-product metal salt. Lithium dihydrogen arsenide may suitably be formed by reaction of butyllithium with arsine gas, such reaction yielding butane and lithium dihydrogen arsenide. In this manner, arsine gas can be converted at the manufacturing facility to the arsine precursor compound, $LiAsH_2$. Lithium dihydrogen arsenide is susceptible to decay to form lithium arsenide, $Li_3As$, but if the lithium dihydrogen arsenide is maintained in a substantially pure state and out of contact with water or other proton donor compounds, its useful life is adequate for utilization as an arsine precursor compound.

With the use of the above-described reaction chemistry to generate arsine gas from a proton donor activation compound and a metal arsenic precursor compound, it is possible to produce arsine gas on demand in situ by selectively flowing the acid gas activator into a reaction vessel containing a bed of the supported solid precursor compound. As a result, arsine gas is generated only when the protonic activator is introduced to the reaction vessel, and arsine is present as a gas only at the desired regulator inlet pressure of the activator species.

As an example, consider a hypothetical 1.5 gallon (5.8 liter) arsine generator capable of generating about 2 pounds of arsine over its useful life. The supported arsenic precursor compound within a 5.8 liter generator (reaction vessel) at a 20% loading of the precursor on the support compound contains 1160 grams of the arsine source compound. For ease of description in the ensuing discussion, the term "equivalent weight" is used in reference to the arsenic-containing precursor compound, and is defined as the weight of precursor compound required to produce one mole of arsine. Thus, if the equivalent weight of the arsenic-containing precursor compound is 100 grams precursor compound per mole of arsine, the amount of arsine that could be generated by the in situ arsine generation unit at 100% conversion is 11.6 moles or 905 grams (2.0 pounds) of arsine (at 79 grams arsine per mole thereof).

For reasons of efficiency, it generally is desired to utilize a loading of the solid precursor compound on the inert support material which is in the range from about 20% to about 40% weight loading (based on the weight of the inert support). As the equivalent weight of the precursor compound is reduced, the same loading of the precursor compound will yield a correspondingly larger amount of generated arsine gas. Increasing the loading of the solid precursor compound on the inert support also increases the amount of the desired arsine product gas. As an example, for the same size reaction vessel as identified above for a 20% loading of the arsine precursor compound, a 40% loading of the precursor compound on the support would provide a capacity of about 4 pounds of arsine gas over the useful life of the generator.

Thus, the amount of arsine that can be generated is directly related to the amount of the precursor compound that is in the reaction vessel, as well as the equivalent weight of the arsenic-containing precursor compound.

A singular characteristic of the in situ arsine generator system of the invention is that the amount of arsine in the gas phase at any particular time is relatively small in comparison to the total amount of arsine gas that can be generated over the lifetime of the generator system, and the generated arsine gas is always at relatively low pressure. By contrast, the entire contents of a high pressure gas cylinder of arsine gas are always available for catastrophic release in the event of cylinder rupture, regulator breakage and leaking, etc.

In the arsine generator system of the invention, the amount of arsine in the gas phase is related to the pressure required to drive the mass flow controller in the associated flow circuitry, as described more fully hereinafter.

As an example of the safety advantage of the arsine generator system of the invention, assuming that the void volume of the reaction vessel containing the bed of supported precursor compound is roughly half of its interior volume, a delivery pressure of 30 psig (two atmospheres) results in a maximum of about 5.8 liters of arsine (at STP conditions) ever being available at one time for release.

By way of perspective, an accidental release of 5.8 liters of arsine into a room having dimensions of 10 ft. × 10 ft. × 8 ft. (800 cubic feet, or 22,600 liters) would yield an effective arsine concentration in the ambient air of 256 parts per million (ppm), assuming that none of the air is exchanged with the environment exterior to such room. In comparison, a high pressure arsine cylinder of similar capacity, e.g., a "G" size cylinder containing 4 pounds of arsine, if defective, could instantly release its entire arsine contents, yielding an arsine concentration of 23,000 ppm in the same size room. In this regard, a concentration of 250 ppm is dangerous to life in an exposure time of 30 minutes duration, while a concentration of 500 ppm is lethal in humans after exposure for only a few minutes, as reported in *Matheson Gas Data Book*, page 41, 1980.

Accordingly, the in situ arsine generator system of the present invention results in a much less catastrophic and more manageable release event. Further, due to the low pressures involved, such release would be less likely to occur with the arsine generator of the invention, as compared with a prior art high pressure cylinder containing the arsine gas. Even if a release of arsine gas from the generator system of the invention were to occur, the small scale of such a release would be readily contained by the venting and scrubbing system associated with the gas cabinet in the semiconductor manufacturing facility, with a wide margin of safety. For example, a gas cabinet containing the arsine generator system of the present invention may also include an associated venting and scrubbing system as disclosed in copending U.S. patent application Ser. No. 07/295,419 filed Jan. 10, 1989 in the names of Glenn M. Tom, James V. McManus, and Bruce A. Luxon, entitled "Composition, Apparatus, and Process, for Sorption of Gaseous Compounds of Group II-VII Elements". The scrubber apparatus disclosed in this copending application could also be incorporated into the arsine generator system as a "sink" means in an inert gas purge cycle, to remove any arsine gas from the reaction vessel during periods of inactivity when arsine is not being generated or in demand in the semiconductor manufacturing plant.

In the arsine generator system of the present invention, the arsine generation reaction advantageously is essentially quantitative with no volatile reaction by-products. Nonetheless, it is a generally advantageous and a preferred feature in the broad practice of the present invention to employ a purifier for treatment of the generated arsine gas, to remove any residual Lewis acid and oxidant impurities, e.g., water and oxygen, therefrom For such purpose, the gas purification technology and purifier vessel apparatus disclosed in my prior U.S. Pat. Nos. 4,761,395; 4,723,967; 4,738,693; and 4,781,900, may be advantageously employed.

Other ancillary equipment may be employed in the arsine generator system to insure the safe, efficient, and trouble-free operation of the arsine generator. Safety feedback loops may advantageously be employed to sense and isolate the generator reaction vessel in the event of an unexpected failure of components in the generator system. The primary sensors may suitably comprise a series of thermocouples to measure the temperature profile of the bed of the supported precursor compound. A pressure sensor is advantageously employed to control the rate of addition of the activator and to sense any over-pressure condition occurring during the generation of arsine gas.

Referring now to FIG. 1 hereof, there is shown a schematic representation of an arsine generator system, according to one embodiment of the present invention. While described hereinafter in terms of the in situ generation of arsine, it will be recognized that the described system may suitably be employed to generate other polyhydridic gaseous compounds of Group IV-VI elements.

In FIG. 1, the arsine generator system 100 is shown as comprising an inert gas feed line 10, having disposed therein a flow control valve 12. The inert feed gas line 10 is connected to conduit 16 joining the activator tank 14 with the regulator head assembly 20. Conduit 16 is provided with a flow restriction 18 therein, upstream of the juncture of conduit 16 with line 10.

The regulator assembly 20 is joined by conduit 22 to mass flow controller 23, which in turn is joined to gas feed conduit 38 having flow control valve 40 disposed therein. The gas feed conduit 38, as shown, extends into the reaction vessel 42, to a lower portion thereof. Also extending into the reaction vessel 42 is a temperature sensing element 36 joined at its upper extremity to temperature controller 34. The temperature controller in turn is joined to the mass flow controller 23 via signal wire 30. Also joined to the mass flow controller 23 in signal transmission relationship via pressure signal transmission line 26, is pressure sensor 28, which is in pressure sensing relation to gas feed conduit 38 by means of pressure tap line 27.

Gas discharge line 44 is joined to an upper portion of reaction vessel 42. Respectively disposed in gas discharge line 44, in series relationship are purifier vessel 46, flow control valve 48, and mass flow controller 50.

Gas discharge line 44 is joined in flow communication with gas feed conduit 38 by means of branch conduit 32, having flow control valve 52 disposed therein. Also joined to gas discharge line 44 is branch conduit 54, having disposed therein, in series relationship, flow control valve 56, scrubber vessel 58 and flow control valve 60.

In the operation of the schematically illustrated FIG. 1 arsine generator system, an inert gas, such as argon, helium, or nitrogen, is introduced to the generator system in line 10 at a suitable flow rate controlled by flow control valve 12. This inert gas is joined with a gaseous activator compound, such as hydrogen chloride, in conduit 16, with the resulting activator/inert carrier gas mixture flowing through the regulator assembly 20, and thereafter through conduit 22, mass flow rate controller 23, and gas feed conduit 38, into the reaction vessel 42.

The reaction vessel 42 contains a suitable quantity of a precursor composition comprising a solid arsine precursor compound on a suitable support. The precursor composition for example may comprise a metal arsenide such as sodium/potassium arsenide on an alumina support, with the support material being in the form of pellets, or in other particulate form, to provide a bed of the precursor composition in the reaction vessel 42.

Thus, the activator/inert carrier gas mixture flows in feed gas conduit 38 into the reaction vessel and reacts therein with the solid precursor compound to generate arsine gas. The product arsine gas then is discharged from the reaction vessel into gas discharge line 44, for passage through purifier vessel 46, wherein any impurities such as water vapor and oxygen are removed. The resulting purified arsine, e.g., containing less than 10 parts per billion reactive impurities such as water or oxygen, then flows in line 44 through flow control valve 48 and mass flow controller 50, and out of the system, to the wafer fabrication apparatus or other end use facilities in which the high purity arsine gas is employed.

The purifier apparatus 46 may suitably comprise a purifier vessel of the type described in my aforementioned U.S. Pat. Nos. 4,723,967 and 4,738,693. Such purifier vessel may suitably contain an impurity scavenger composition as described in my prior issued patent U.S. Pat. No. 4,761,395, which discloses a composition for purifying arsine to remove Lewis acid and oxidant impurities therefrom.

In the event that it becomes desirable in operation to void the reaction vessel 42 of any arsine content therein, e.g., when such vessel is to be taken out of service or retained in an inactive condition for an extended period of time, the flow control valve 48 in gas discharge line 44 may be closed to divert gas from the reaction vessel 42 into branch conduit 54, with flow control valve 56 being open to cause such gas to be flowed into the scrubber 58. The scrubber may for example be constructed in accordance with the teachings of the aforementioned copending U.S. application Ser. No. 07/295,419 filed Jan. 10, 1989, the disclosure of which hereby is incorporated by reference herein. Such scrubber serves the purpose of effectively sorbing gross quantities of the arsine constituent of gas flowed from the reaction vessel 42 into branch conduit 54. During the flow of gas into the scrubber, valve 60 may be opened to effect discharge of any non-sorbed inert gas constituent of the gas entering the scrubber in conduit 54.

In some instances, it may be desirable to flow the gaseous activator component to the downstream facilities via gas discharge line 44, as for example where hydrogen chloride is the activator gas constituent, during arsine generation, but is also used by itself when arsine is not being generated, for cleaning of susceptors in the semiconductor manufacturing facility, or as an etchant in the semiconductor manufacturing process. To effect such flow of the gaseous activator constituent to the downstream facilities, the flow control valves 40 and 48 is closed, and the flow control valve 52 in bypass conduit 32 is opened.

In operation, the temperature in the reaction vessel 42 is monitored by the thermal sensing element 36, and the mass controller 23 correspondingly is selectively adjusted by the control signal which is generated by temperature controller 3 and transmitted in signal line 30 to the mass flow controller. Flow of gases into and out of the reaction vessel 42 is controlled by the respective inlet and outlet mass flow controllers 23 and 50.

There are at least two control options for the arsine generator schematically shown in FIG. 1. In the limit, the rate of generation of arsine can be controlled by maintaining the pressure in the reaction vessel, as sensed by the pressure sensor 28 which is in gas flow communication with the gas feed conduit 38, and responsively adjusting the mass flow controller 23 by a pressure control signal transmitted to the mass flow controller by signal line 26. In such arrangement, the pressure sensor is the limiting detector. On the other hand, the mass flow of the gaseous activator constituent into the reaction vessel 42 can be matched to the flow of arsine out of the vessel in gas discharge line 44, by coupling of the respective mass flow controllers 23 and 50 in suitable fashion.

The arsine generator system schematically shown in FIG. 1 produces arsine gas in situ on demand, and the arsine precursor components therein is an air-stable, non-volatile solid during storage and periods of inactivity (non-generation of arsine gas). The gaseous inventory in the generator system of the invention will thereby be significantly reduced, to less than 1% of the normal maximum inventory of a typical high pressure arsine gas cylinder system.

Figure 2:
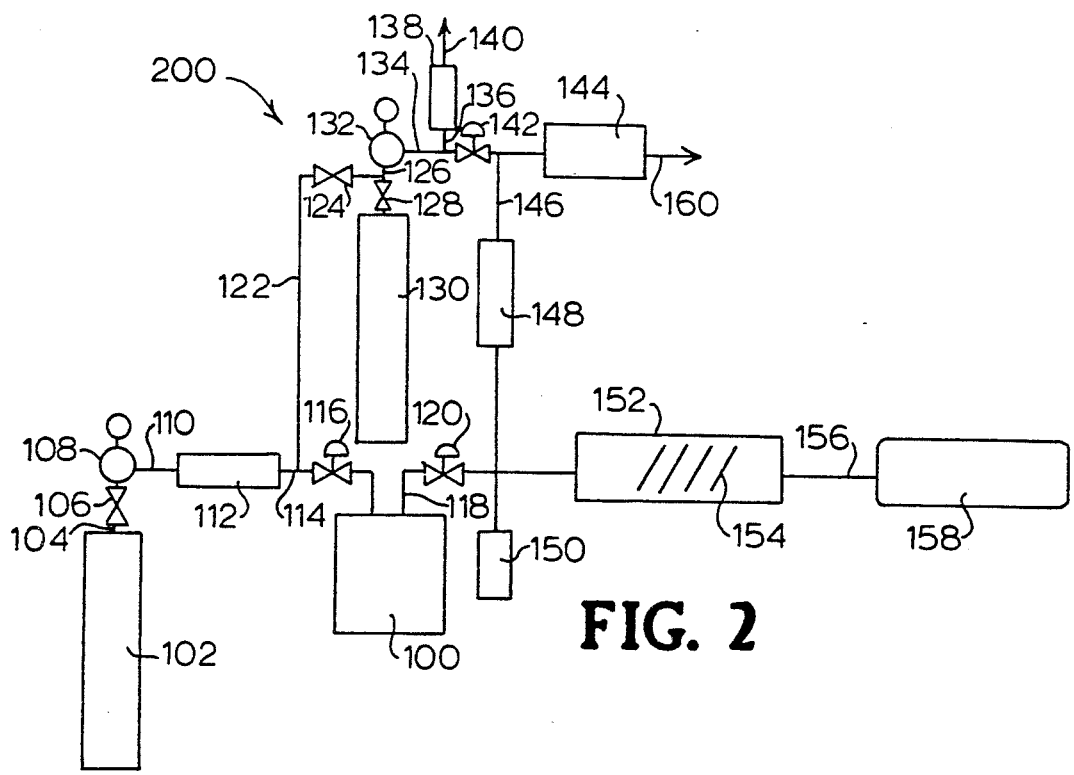
FIG. 2 is a schematic representation of a process system for integrated semiconductor manufacturing operations, utilizing the in situ generating system of FIG. 1 for production of polyhydridic Group IV-VI gaseous compounds therein.

FIG. 2 is a schematic representation of a semiconductor manufacturing process system, utilizing the arsine generator system of the present invention, in one embodiment thereof.

The FIG. 2 semiconductor manufacturing process system 200 comprises an arsine generator system 100 which may suitably be of a type as shown and described herein with reference to FIG. 1 hereof.

The process system comprises inert gas vessel, 102, which is joined to regulator assembly 108 by conduit 104 having flow restriction 106 disposed therein. The regulator assembly 108 is joined by conduit 110 to purifier 112, which in turn is joined by conduit 114, having flow control valve 116 therein, to the arsine generator system 100.

The arsine generator system 100 is joined by discharge conduit 118, having flow control valve 120 disposed therein, to semiconductor wafer oven 152 having wafers 154 schematically shown therein. The wafer oven 152 is joined by conduit 156 to scrubber 158.

A dopant delivery system 150 is joined to conduit 146, which in turn is joined to gas discharge conduit 118, as well as to conduit 134. Conduit 146 has reactive gas purifier 148 disposed therein, between the junctures of conduit 146 with conduits 134 and 118, respectively.

The semiconductor manufacturing process system of FIG. 2 further comprises a reactive gas vessel 130 joined to gas regulator assembly 132 by conduit 126 having flow restriction 128 therein. Conduit 126 also is joined to branch conduit 122, having flow restriction 124 disposed therein, and conduit 122 is joined at its opposite end to gas feed conduit 114. The gas regulator assembly 132 is joined by conduit 134, having flow discharge line 160 joined thereto. Conduit 134 also communicates with conduit 136, which in turn is joined to vent gas scrubber 138. The vent gas scrubber 138 is provided with discharge line 140.

In operation of the FIG. 2 process system, inert carrier gas from vessel 102 flows in line 104 to regulator assembly 108 and from the regulator flows in conduit 110 to purifier vessel 112. Purifier vessel 112 may suitably comprise a vessel of the type described in my aforementioned U.S. Pat. Nos. 4,723,967 and 4,738,693, and may contain an inert gas scavenger composition of the type described in my U.S. Pat. No. 4,950,419 issued Aug. 21, 1990, the disclosures of which hereby are incorporated by reference herein. The resultingly purified inert gas from purifier 112 is flowed in conduit 114 to the arsine gas generator system 100.

A gas mixture, comprising generated arsine gas and inert carrier gas, is discharged from the arsine gas generator system 100 in conduit 118, and is mixed with a dopant from the dopant delivery system 150 which is joined in flow communication with conduit 118 by conduit 146. The resulting dopant-containing arsine gas mixture then is flowed from conduit 118 into wafer oven 152, for deposition therein of doped arsenic onto wafers 154. Arsenic-depleted gas mixture resulting from the deposition of arsenic and dopant then flows from the wafer oven 152 in conduit 156 to scrubber 158, which may be of a type similar to that illustratively described in connection with FIG. 1 hereof (element 58 therein).

In some instances, it may be desirable to add to the arsine gas mixture delivered to the wafer oven in conduit 118 a reactive gas consituent, e.g., hydrogen selenide in GaAs and AlGaAs compound semiconductor applications. For such purpose, the process system shown in FIG. 2 includes a reactive gas vessel 130 from which reactive gas may be flowed in conduit 126, being mixed in such conduit with a suitable proportion of the inert carrier gas which is flowed to conduit 126 in the bypass conduit 122. The resulting reactive gas/inert carrier gas mixture then flows from the regulator assembly 132 in conduit 134 to conduit 146, passing through the reactive gas purifier 148 prior to being added to the arsine gas stream in conduit 118. The reactive gas purifier 148 may suitably be of a type similar to that described hereinabove with reference to the FIG. 1 arsine generator system (element 46 thereof).

In order to vent process gases from the semiconductor manufacturing system, a vent gas conduit 136 is joined to conduit 134, and conducts vent gas to the vent gas scrubber 138. The vent gas scrubber may suitably be of a type as disclosed in the aforementioned U.S. Patent application Ser. No. 07/295,419 filed Jan. 10, 1989, the disclosure of which is hereby incorporated herein by reference. The vent gas after passage through the vent gas scrubber 138 is discharged from the system in vent gas line 140.

In some applications, it may be desirable to provide a bulk sorption device in communication with the semiconductor manufacturing process system, to sorb process gases in volume, in the event of the occurrence of hazardous leakages, etc., the process system. For such purpose, the FIG. 2 process system comprises a bulk sorption unit 144, also termed a "scram" unit, in communication with the process system by means of line 134, and also comprising a gas discharge line 160. The scram unit may suitably of a type as also described in the aforementioned U.S. Ser. No. 07/295,419 filed Jan. 10, 1989.

Figure 3:
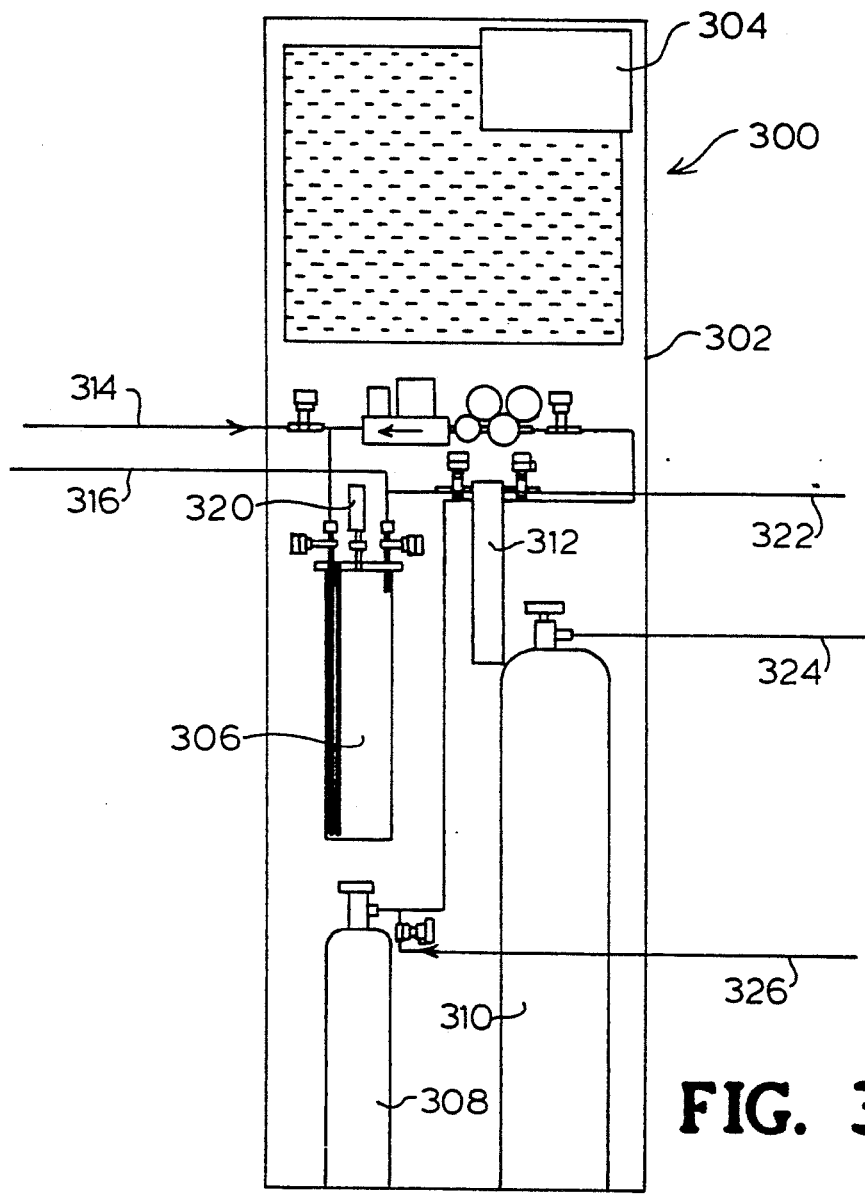
FIG. 3 is a schematic representation of a gas cabinet assembly, in which is disposed an in situ polyhydridic Group IV-VI gaseous compound generating system, according to one embodiment of the present invention.

FIG. 3 is a schematic representation of a gas cabinet assembly 300 in which an arsine generator of the type shown in FIG. 1 may advantageously be deployed in the semiconductor manufacturing facility.

The gas cabinet assembly 300 comprises gas cabinet 302 which may be of a conventional construction, as known to those skilled in the art and typically employed in semiconductor manufacturing plants.

The gas cabinet 302 comprises the schematically illustrated controller 304 as a master control system for monitoring and selectively adjusting the control system elements in the gas cabinet.

In the gas cabinet is provided a cylinder 310 of inert gas, joined at the valve head thereof to inert gas manifold line 324. Joined in flow communication to the inert gas manifold (not shown) are inert gas purg lines 314 and 326.

The gas cabinet further contains a cylinder 308 of activator, such as gaseous hydrogen chloride, joined by connecting piping to scrubber 312 and the precursor compound reaction vessel 306. The reaction vessel in turn is coupled with arsine manifold feed line 316 and inert gas purge line 314. As previously described in connection with 1, a pressure sensor 320 is associated with the reaction vessel 306, and coupled with a feed mass controller (not shown) in the system to regulate the production of arsine in the system. The scrubber 312 in this system is joined to the vent gas discharge line 322.

The gas cabinet assembly shown in FIG. 3, although broadly described above with reference to its major components, will be understood to comprise an arsine generator system of a type as shown and described hereinabove in connection with FIG. 1, in a compact and readily assembled arrangement. The in situ gas generation system in the gas cabinet may thus be deployed and operated in a manner consistent with the description of the operation of the arsine generation system of FIG. 1 herein.

Figure 4:
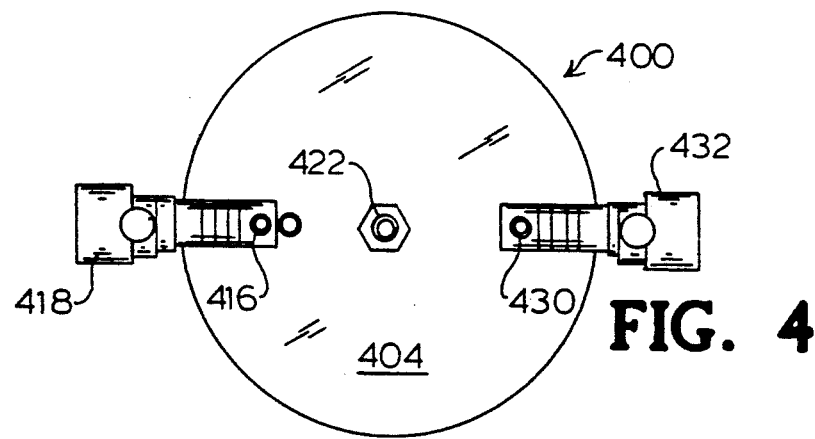
FIG. 4 is a top plan view of a solid precursor compound reaction vessel according to the present invention, wherein the polyhydridic Group IV-VI gaseous compound may be generated by reaction with a suitable gaseous protonic activator compound.
Figure 5:
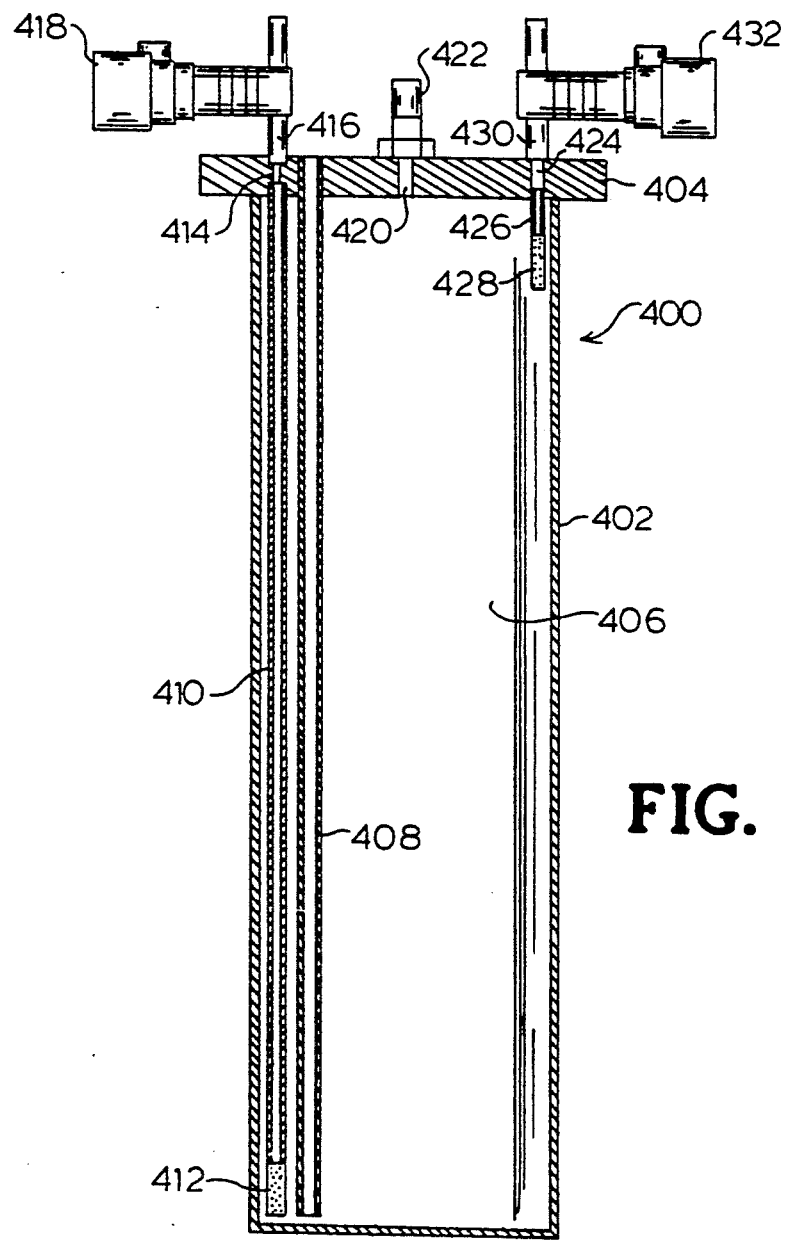
FIG. 5 is an elevation view, in partial section, of the precursor compound reaction vessel whose top plan view is shown in FIG. 4, illustrating the internal structure of such vessel.

FIG. 4 is a top plan view, and FIG. 5 a corresponding elevation view, in partial section, of a precursor compound reaction vessel 400 according to the present invention, in one embodiment thereof.

The precursor compound reaction vessel 400 as shown comprises a receptacle 402 defining an enclosed interior space 406 in which a bed of a precursor composition (not shown), comprising a precursor compound suitably dispersed on an inert substrate material, is provided.

The receptacle 402 is joined at its upper end, by any suitable joining means or method, such as welding, adhesive bonding, mechanical attachment, etc., to cover block 404, which may suitably have a cylindrical shape, as shown.

Extending through and downwardly from the cover block 404 is a temperature sensing element 408, which is of a type suitably employable to monitor the temperature in the precursor composition bed in the receptacle 402. As described in connection with the FIG. 1 system, the temperature sensing element 408 may suitably be joined to a temperature controller which is operatively arranged to transmit control signals to a mass flow controller to effect process control and maintain a predetermined maximum temperature limit in the precursor reaction vessel 400.

Centrally located in the cover block 404 is a fill passage 420, for introduction of active precursor composition to the vessel, and removal of spent precursor composition therefrom. The fill passage 420 has associated therewith a closure means 422, to isolate the precursor composition in the vessel from contact with atmospheric gases.

The cover block 404 further includes passage 414 communicating with a lower enlarged recess in which is journaled a gas feed conduit 410. The passage 414 in the cover block 404 also communicates with an upper enlarged recess in which is positioned the gas feed conduit 416, having flow control valve 418 associated therewith.

At the lower end of the gas feed tube 410 is provided a porous element 412 serving to disperse the influent gas into the interior space 406 of the receptacle 402, and to concurrently prevent any extraneous solids present in the influent gas from being introduced into the precursor composition bed. The porous element 412 may suitably be of a type as described in the aforementioned U.S. patent application Ser. No. 07/295,419 Jan. 10, 1989.

The cover block 404 also has an opening therein diametrically opposite the flow passage 414, in which are reposed a downwardly depending effluent gas conduit 426, and an upwardly depending gas discharge conduit 430 with which flow control valve 432 is associated. The effluent gas conduit 426 has at its lower extremity a porous element 428, which may be of a same or similar type to element 412 previously described.

In the operation of the precursor composition reaction vessel shown in FIGS. 4 and 5, activator gas is introduced to the vessel in conduit 416 and passes therefrom into passage 414 of the cover block 404 and subsequently into gas feed tube 410, for dispersed introduction of the activator gas to the precursor bed from porous element 412. During the contacting of the activator gas with the solid precursor composition, the temperature of the precursor bed is sensed by thermal sensing element 408. The arsine gas resulting from the reaction of the activator with the arsine precursor composition in the bed (not shown) in the interior space 406 of receptacle 402 passes upwardly from the precursor composition bed through the porous element 428 and gas discharge tube 426 to gas discharge conduit 430 for flow to subsequent use facilities.

As an example of a specific embodiment of the precursor vessel of the type illustratively shown in FIGS. 4 and 5, the receptacle 402 may be constructed of stainless steel with an outer diameter of 6 inches and a height of approximately 20 inches, to provide an interior space (406 in FIG. 5) having a volume of 7.5 liters, and holding about 2 gallons of the arsine precursor material. Such vessel may suitably contain 750 grams of the arsine precursor composition, at 10% weight loading of the precursor compound on the inert support.

If in the vessel described in the preceding paragraph, zinc arsenide ($Zn_3As_2$) is employed as the arsine precursor compound, the number of moles of arsine which can be produced by the arsine generator unit is 0.75 pounds arsine, at 100% conversion of the precursor compound to produce arsine gas. If the arsine precursor material is sodium dihydrogen arsenide (NaAsH$_2$), the amount of arsine generatable by the unit is 1.3 pounds arsine. If aluminum arsenide is the precursor material, 1.3 pounds of arsine product gas can be produced.

The foregoing arsine generation values are all based on 10% weight loading of the precursor compound on the inert support. At a 20 weight percent loading, the quantities of arsine generatable would be twice those given for a 10 weight percent loading. In general, it is suitable to employ a weight loading of the precursor compound on the inert support of from about 5% to about 50% (weight percent), preferably from about 10% to about 45%, and most preferably from about 20% to about 40%.

Figure 6:
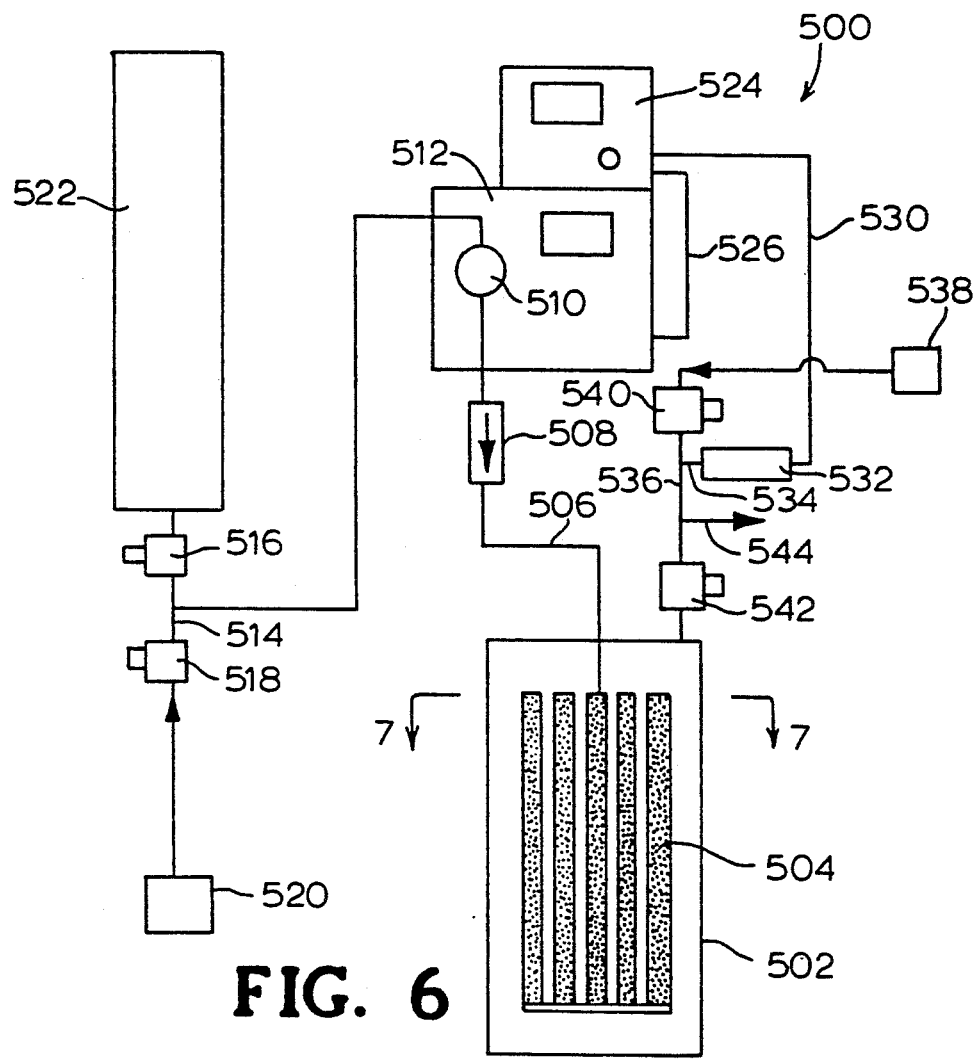
FIG. 6 is a schematic illustration of another process system for in situ generation of polyhydridic Group IV-VI gaseous compounds, according to a further embodiment of the present invention.
Figure 7:
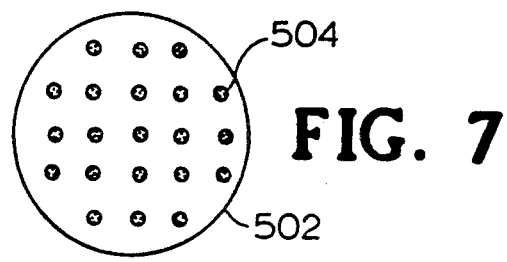
FIG. 7 is a top plan view of the precursor compound reaction vessel shown in FIG. 6, taken along line 7—7 thereof.
Figure 8:
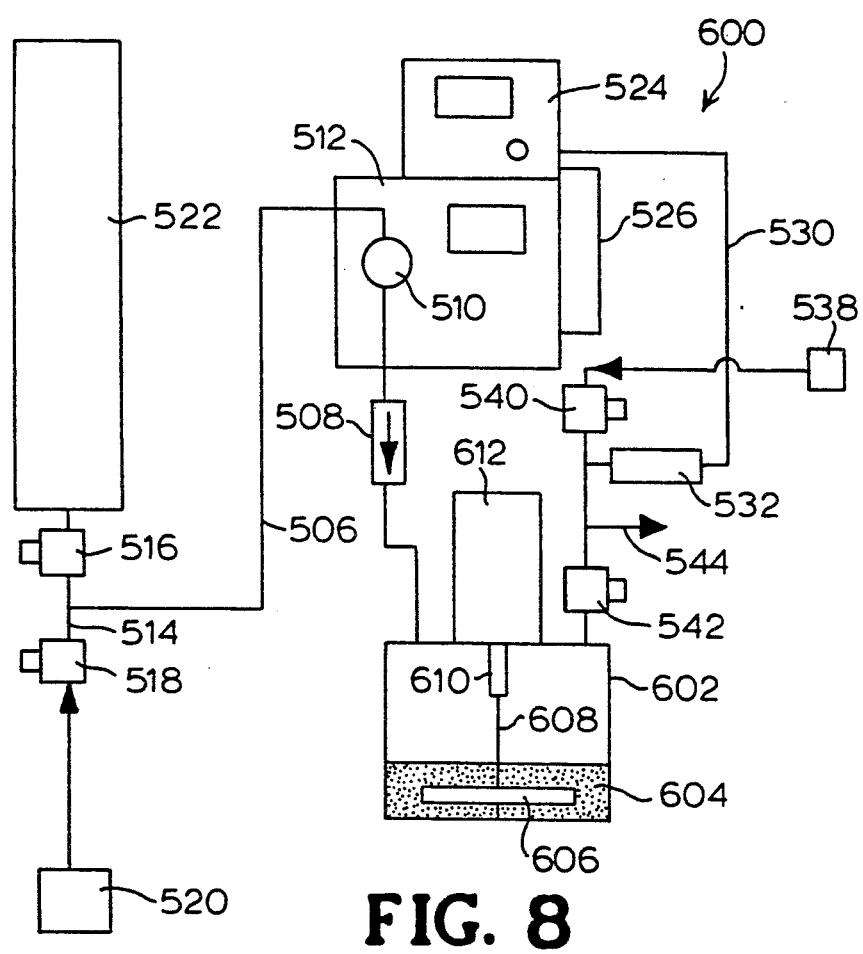
FIG. 8 is a schematic illustration of yet another process system for in situ generation of polyhydridic Group V-VI gaseous compounds, according to another embodiment of the present invention.

FIGS. 6–8 hereof are schematic representations of process systems for generating arsine gas from a [sodium/potassium] dihydrogen arsenide precursor compound and water as a liquid-phase activator compound. The precursor compound for this purpose may be of the formula Na$_{1-x}$/K$_x$AsH$_2$, wherein x is a number having a value of from 0 to 1. In the process system of FIGS. 6–7, as described hereinafter in detail, the precursor compound is supported on an inert support such as alumina, while in the FIG. 8 process system the precursor compound is utilized in solid particulate form, devoid of any associated support or substrate material.

Referring now to FIGS. 6 and 7, the process system 500 comprises a reaction vessel 502 containing a longitudinally extending array of porous distribution tubes 504, deployed in the arrangement shown in FIG. 7, which is a top plan view of the tube array, taken along line 7—7 of FIG. 6.

The walls of the porous distribution tubes 504 comprise a porous matrix which may be formed of any suitable material such as sintered stainless steel. Surrounding the distribution tubes and in contact with their exterior surfaces is a bed of the precursor composition comprising the precursor compound on an alumina support.

The array of porous distribution tubes 504 is joined to activator feed conduit 506 by means of a suitable fluid distributor or header means (not shown) at the terminal end of line 506 in reaction vessel 502.

The activator feed line 506 has disposed therein a check valve 508, and is coupled with a pump head 510 of the high pressure pump 512, as shown.

At its opposite end from the reaction vessel 502, the activator feed conduit 506 is joined to line 514, which in turn has isolation valve 516 and inert gas on/off controller 518 disposed therein. Line 514 is joined at one end to a source 520 of inert gas, and is joined at its opposite end to activator reservoir 522.

High pressure pump 512 has associated therewith a pressure controller 524, with the pressure controller being coupled in controlling relationship to high pressure pump 512 by means of signal transmission line 526. Pressure controller 524 also is joined by means of pressure sensor line 530 to pressure sensor 532. The pressure sensor 532 is connected by pressure tap line 534 to line 536.

Line 536 is joined at one end to vessel 502 and at its other end is joined to inert gas source 538, as shown. Line 536 has disposed therein an inert gas on/off controller 540 and reaction vessel isolation valve 542. Intermediate the controller 540 and isolation valve 542 is a branch discharge line 544 communicating with line 536.

In operation, the sodium/potassium dihydrogen arsenide precursor compound supported on alumina is provided in the form of a packed bed in reaction vessel 502, surrounding and in contact with the exterior surfaces of the porous distribution tubes 504, and water is provided in activator reservoir 522 for reaction therewith. The reservoir 522 is weakly pressurized with an inert gas introduced from inert gas source 520 through line 514 to the reservoir, with the inert gas on/off controller 518 in the "on" mode and with the water isolation valve being open to admit the inert gas into the reservoir. Such inert gas pressurization of the water in the reservoir 522 aids in priming of the high pressure pump 512. In order to produce 1 pound of product arsine gas in the system shown in FIGS. 6–7, the approximate amount of water required in reservoir 522 is in the vicinity of 100 milliliters. Accordingly, the reservoir can be quite small in size. If desirable, the reservoir may be provided with a sight glass (not shown) or other monitoring means for readily visually indicating the remaining capacity in the arsine generator system.

In the arsine generating mode, the inert gas on/off control 518 is in the "off" condition, and the activator isolation valve 516 is opened to permit water to flow from reservoir 522 in line 514 to activator feed line 506, with the high pressure pump 512 being actuated to flow the water into the reaction vessel 502 at a predetermined rate. The check valve 508 in activator line 506 prevents back flow of the hydride gas product (arsine) into the water reservoir system.

In the reaction vessel 502 the influent water from activator feed line 506 is formed by suitable distributor or header means (not shown) into the porous distribution tubes 504. The porous distribution tubes may for example have an outer diameter of from 0.125 to 0.250 inch, and are characterized by low dead internal volume. When water is flowed into such sintered metal matrix tubes, the water wicks through the sintered matrix tube wall into the packed bed of supported precursor compound (not shown) surrounding the distribution tubes. In order that a minimum dead space is provided in the interior of the porous distribution tubes, it may be suitable in some instances to provide a scored "filler" rod within such tubes, which provides only sufficient space in the scorings for water to flow down through the entire length of the tube interior volume, in contact with the sintered matrix wall of the tubes. The packed bed of supported precursor compound surrounding the porous distribution tubes may for example be in the form of particles having a particle size distribution of from about 150 to about 60 mesh. In practice any suitable supported precursor composition may be employed depending on the nature, characteristics, and operation of the reaction vessel in which same is employed, and the hydride product gas to be produced. Likewise, the porosity and mean pore size of the sintered metal porous distribution tubes may be widely varied depending on the specific end use application of the hydride generator system. For example, the porous distribution tubes may be formed of sintered stainless steel having a mean pore size in the range of from about 0.5 to about 100 microns.

Thus, the water flows into the interior of the porous distribution tubes, wicks through the walls thereof and is contacted with the precursor composition in the packed bed surrounding the distribution tubes. The precursor and water activator thereby react, to form arsine gas, and solid reaction by-products comprising hydroxides of the sodium/ potassium constituent of the precursor composition.

The product arsine gas is discharged from the reaction vessel 502 into line 536, isolation valve 542 being open during active arsine generation operation, and is then discharged from the system in line 544. The product arsine may be discharged in an inert carrier gas, if desired, by opening of the inert gas on/off control 540 to admit inert gas from source vessel 538 into line 536 for combination with the generated arsine therein and discharge of the combined arsine/inert gas mixture in line 544.

During active operation of the FIG. 6 system, the pressure in line 536 is sensed by the pressure sensor 532 connected to line 536 by branch line 534. In response to the sensed pressure, the pressure sensor sends a signal indicative of the sensed pressure via signal transmission line 530 to pressure controller 524, which then correspondingly adjusts the high pressure pump 512 by an appropriate control signal transmitted to the pump by signal transmission line 526. In this fashion, the high pressure pump is actuated or deactuated by the pressure controller, to maintain a selected internal pressure level in the gas generator system.

All of the vessels and conduit lines associated with the activator should be at low dead volume for high efficiency utilization of the activator in the gas generating operation. The amount of water which is required in this illustration process system to generate one liter of hydride gas (arsine) is only 0.8 milliliter; accordingly, if large dead volume transfer lines are used, there is the possibility of accumulation of large amounts of the hydride product gas in the system as the "dead volume" water leaks into the reaction vessel.

FIG. 8 is a schematic representation of a process system for generating arsine gas in situ from a precursor composition comprising the same precursor compound as described in connection with the embodiment of FIGS. 6-7, but without any associated support. The precursor composition in the FIG. 8 system may likewise be in the form of pellets or other particles, of suitable size.

The FIG. 8 system 600 comprises a reaction vessel 602 containing a bed 604 of precursor compound particles. In this bed is disposed a magnetically driven stir bar 606 mounted for rotation on shaft 608 which is in turn joined to a magnetic coupler 610. In magnetic driving relationship to the magnetic coupler 610 is a magnetic stirrer drive 612, which is joined to a suitable power supply means (not shown) for operating same.

Apart from the reaction vessel and associated stirring means, the construction of the hydride gas generator system of FIG. 8 is identical to that shown in FIG. 6. The illustrated FIG. 8 system is appertainingly numbered with respect to, and operated in the manner previously described in connection with, FIG. 6.

Thus, in operation of the FIG. 8 system, water from reservoir 522 is admitted from activator feed line 506 into reaction vessel 602. In the reaction vessel, the unsupported precursor compound in bed 604 is stirred by the magnetically driven stir bar 606 to effect contacting of the water and precursor compound, for reaction therebetween to form the desired hydride product gas.

The advantage of the magnetic stirring system and closed reaction vessel 602 in the FIG. 8 process system is that there is no packed seal through which the product hydride gas can escape to the ambient exterior environment of the system. Further, the position of the magnetic drive and coupler prevents significant fouling of the stirrer means in the operation of the reaction vessel.

While the invention has been described with reference to specific aspects, features, and embodiments thereof, it will be apparent that numerous variations, modifications, and other embodiments may be employed, and accordingly, all such variations, modifications, and embodiments are to be regarded as being within the spirit and scope of the invention.

What is claimed is:

1. A system for generating, in situ, on demand, and at a selected delivery rate, a gaseous polyhydridic compound of the formula:

$$GH_n$$

wherein:
n is a number having a value of 2 to 4, inclusive; and
G is an n-valent Group IV–VI element,
said system comprising:
(i) a reaction vessel containing a composition comprising a solid precursor compound for said polyhydridic compound, of the formula:

$$M_xG_yH_z.$$

wherein:
M is a metal moiety selected from the group consisting of lithium, sodium, magnesium, zinc, potassium, aluminum, and intermetallic complexes and alloys thereof;
x is a number having a value of from 1 to 3, inclusive;
y is a number having a value of from 1 to 2, inclusive; and
z is a number having a value of from 0 to 4, inclusive; and
wherein said solid precursor compound is dispersed on an inert support;
(ii) a source of fluid-phase protonic activator compound which is reactive with said precursor compound to yield a reaction product comprising (a) said polyhydridic compound, and (b) a solid reaction product compound containing said metal moiety M;
(iii) means for flowing said activator compound from said source thereof to said reaction vessel containing the solid precursor compound, for reaction of the activator compound with the solid precursor compound to form the polyhydridic compound in said reaction vessel;
(iv) means for controllably adjusting the rate of flow of said activator compound in said flowing means (iii);
(v) means for discharging the polyhydridic compound from said reaction vessel; and
(vi) means for sensing a process conditions correlative to the rate of production of polyhydridic compound in said reaction vessel and responsively thereto actuating said controllably adjusting means (iv) to adjust the rate of flow of the activator compound in said flowing means to maintain a selected rate of production of polyhydridic compound in said reaction vessel.

2. A system according to claim 1, wherein G is an element selected from the group consisting of silicon, phosphorus, arsenic, antimony, sulfur, selenium, and tellurium.

3. A system according to claim 1, wherein the protonic activator compound is selected from the group consisting of hydrogen halides and water, and the solid precursor compound is selected from the group consisting of: $Li_3As$; $LiAsH_2$; $NaAsH_2$; $Mg(AsH_2)_2$; $Zn_3As_2$; AlAs; and $[Na/K]AsH_2$, and wherein the solid precursor compound is dispersed on an alumina support.

4. A system according to claim 1, wherein said inert support comprises a material selected from the group consisting of alumina, silica, kieselguhr, activated carbon, metal fluorides, polystyrene-divinylbenzene, and fluorocarbon polymers.

5. A system according to claim 1, wherein said inert support comprises alumina.

6. A system according to claim 1, wherein said fluid-phase protonic activator compound is a gas-phase protonic activator compound.

7. A system according to claim 1, wherein said fluid-phase protonic activator is a liquid-phase protonic activator compound.

8. A gas cabinet comprising a system according to claim 1.

9. A system according to claim 1, wherein said sensing/activating means (vi) comprise means for sensing process condition(s) selected from the group consisting of: pressure of the activator compound flowed to the reaction vessel; pressure in the reaction vessel; pressure of the polyhydridic compound-containing gas discharged from the reaction vessel; and temperature in the reaction vessel.

10. A system according to claim 1, wherein said controllably adjusting means (iv) comprise a mass flow controller operatively associated with said flowing means (iii).

11. A system according to claim 1, wherein said sensing/actuating means (vi) sense process conditions comprising temperature in the reaction vessel, and pressure level in the reaction vessel.

12. A system according to claim 1, wherein is devoid of heating means.

13. A system according to claim 1, further comprising a source of inert carrier gas; and means for flowing said insert carrier gas from said source thereof to said flowing means (iii), whereby said inert carrier gas is flowed to said reaction vessel with said activator compound.

14. A method of generating, in situ, on demand, and at a selected delivery rate, a gaseous polyhydridic compound of the formula:

$$GH_n$$

wherein:
n is an integer having a value of 2 to 4, inclusive, and
G is an n-valent Group IV-VI element;
comprising: providing a reaction vessel containing a solid precursor compound for said polyhydridic compound, of the formula:

$$M_xG_yH_z,$$

wherein:
M is a metal moiety selected from the group consisting of lithium, sodium, magnesium, zinc, potassium, aluminum, and intermetallic complexes and alloys thereof;
x is a number having a value of 1 to 3, inclusive;
y is a number having a value of from 1 to 2, inclusive; and
z is a number having a value of from 0 to 4, inclusive; and wherein said solid precursor compound is dispersed on an inert support;
flowing a fluid-phase protonic activator compound into said vessel for reaction of the activator compound with the solid precursor compound therein, to yield a reaction product comprising (i) said polyhydridic compound, and (ii) a solid reaction product compound containing said metal moiety M;
sensing a process condition correlative with the rate of production of polyhydridic compound in the reaction vessel;
responsively to the process condition sensing, adjusting the rate of flow of activator compound into the reaction vessel to maintain a selected rate of production of polyhydridic compound in said reaction vessel; and
discharging gas comprising the polyhydridic compound from the reaction vessel at the selected delivery rate corresponding to the selected rate of production of polyhydridic compound in the reaction vessel.

15. A method according to claim 14, wherein G is an element selected from the group consisting of silicon, phosphorus, arsenic, antimony, sulfur, selenium, and tellurium.

16. A method according to claim 14, wherein the protonic activator compound is selected from the group consisting of hydrogen halides and water, and the solid precursor compound is selected from the group consisting of: $Li_3As$; $LiAsH_2$; $NaAsH_2$; $Mg(AsH_2)_2$; $Zn_3As_2$; AlAs; and $[Na/K]AsH_2$, and wherein the solid precursor compound is dispersed on an alumina support.

17. A method according to claim 14, wherein said inert support comprises a material selected from the group consisting of alumina, silica, kieselguhr, activated carbon, metal fluorides, and fluorocarbon polymers.

18. A method according to claim 17, wherein said inert support comprises alumina.

19. A method according to claim 14, wherein said process condition of the sensing step comprises a process condition selected from the group consisting of:
pressure of the activator compound flowed to the reaction vessel;
pressure in the reaction vessel;
pressure of the polyhydridic compound-containing gas discharged form the reaction vessel; and
temperature in the reaction vessel.

20. A method according to claim 14, comprising the further steps of providing a mass flow controller for selectively adjusting the flow rate of activator compound flowed to the reaction vessel, and in response to sensing of said process condition, responsively adjusting the mass flow controller to achieve a predetermined flow rate of said activator compound to the reaction vessel.

21. A method according to claim 14, carried out under ambient temperature conditions.

22. A system for generating, in situ, on demand, and at a selected delivery rate, a gaseous polyhydridic compound of the formula:

$GH_n$ wherein:
n is a number having a value of 2 to 4, inclusive; and
G is an n-valent Group IV-VI element,
said system comprising:
(i) a reaction vessel containing a composition comprising a solid precursor compound for said polyhydridic compound of the formula:

$M_xG_yH_z$, wherein:
M is a metal moiety selected from the group consisting of lithium, sodium, magnesium, potassium, aluminum, and intermetallic complexes and alloys thereof;
x is a number having a value from 1 to 3, inclusive;
y is a number having a value of from 1 to 2, inclusive; and
z is a number having a value of from 0 to 4, inclusive;
(ii) a source of fluid-phase protonic activator compound which is reactive with said precursor compound to yield a reaction product comprising (a) said polyhydridic compound, and (b) a solid reaction product compound containing said metal moiety M; p1 (iii) means for flowing said activator compound form said source thereof to said reaction vessel containing the solid precursor compound, for reaction of the activator compound with the solid precursor compound to form the polyhydridic compound in said reaction vessel; and
(iv) means for discharging gas comprising the polyhydridic compound from said reaction vessel.

23. A system for generating arsine, in situ, on demand, and at a selected delivery rate, said system comprising:
(i) a reaction vessel containing a composition comprising a solid precursor compound for arsine, of the formula:

$KAsH_2$ (ii) a source of fluid-phase protonic activator compound which is reactive with said precursor compound to yield a reaction product comprising (a) arsine, and (b) a solid reaction product compound containing potassium as a metal moiety thereof;
(iii) means for flowing said activator compound from said source thereof to said reaction vessel containing the solid precursor compound, for reaction of the activator compound with the solid precursor compound to form arsine in said reaction vessel; and
(iv) means for discharging gas comprising the polyhydridic compound from said reaction vessel.

* * * * *

UNITED STATES PATENT AND TRADEMARK OFFICE
CERTIFICATE OF CORRECTION

PATENT NO. : 5,156,827

DATED : October 20, 1992

INVENTOR(S) : Glenn M. Tom, et al

It is certified that error appears in the above-identified patent and that said Letters Patent is hereby corrected as shown below:

Column 9, lines 4-5, change "protonysis" to -- protonlysis--.

Column 13, line 19, change "3" to --34--.

Column 14, line 21, change "4,723,967" and "4,738,693" to --4,723,967-- and 4,738,693--. (delete bold face)

Column 15, line 36, before "1" insert --FIG.--.

Column 16, lines 60 and 61, change "6" and "20" to --6-- and --20--. (delete bold face)

Column 23, line 28, delete "pl".
Column 23, line 29, change "form" to --from--.

Column 8, line 61, change "HCL" to --HCl--.

Signed and Sealed this

Nineteenth Day of April, 1994

Attest:

BRUCE LEHMAN

Attesting Officer

Commissioner of Patents and Trademarks